(12) United States Patent
Kim

(10) Patent No.: US 7,365,490 B2
(45) Date of Patent: Apr. 29, 2008

(54) PLASMA DISPLAY DEVICE

(75) Inventor: Chun-Soo Kim, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 536 days.

(21) Appl. No.: 10/981,544

(22) Filed: Nov. 5, 2004

(65) Prior Publication Data

US 2005/0110407 A1    May 26, 2005

(30) Foreign Application Priority Data

Nov. 26, 2003   (KR) .................. 10-2003-0084482

(51) Int. Cl.
*H01J 17/49* (2006.01)

(52) U.S. Cl. .............. 313/582; 313/583; 313/586; 313/587; 315/169.3; 315/169.4; 361/681

(58) Field of Classification Search ............. 313/504, 313/512, 582, 583–587; 315/169.3, 169.4; 361/681
See application file for complete search history.

(56) References Cited

U.S. PATENT DOCUMENTS

| | | | |
|---|---|---|---|
| 5,541,618 A | 7/1996 | Shinoda | |
| 5,661,500 A | 8/1997 | Shinoda et al. | |
| 5,663,741 A | 9/1997 | Kanazawa | |
| 5,674,553 A | 10/1997 | Sinoda et al. | |
| 5,724,054 A | 3/1998 | Shinoda | |
| 5,786,794 A | 7/1998 | Kishi et al. | |
| 5,952,782 A | 9/1999 | Nanto et al. | |
| RE37,444 E | 11/2001 | Kanazawa | |
| 6,359,390 B1* | 3/2002 | Nagai | 315/169.1 |
| 6,630,916 B1 | 10/2003 | Shinoda | |
| 6,707,436 B2 | 3/2004 | Setoguchi et al. | |
| 2003/0020152 A1* | 1/2003 | Inoue et al. | 257/684 |
| 2003/0184225 A1* | 10/2003 | Namiki et al. | 313/582 |

FOREIGN PATENT DOCUMENTS

CN          1324474        11/2001

(Continued)

OTHER PUBLICATIONS

"Final Draft International Standard", Project No. 47C/61988-1/Ed. 1; Plasma Display Panels—Part 1: Terminology and letter symbols, published by International Electrotechnical Commission, IEC. in 2003, and Appendix A—Description of Technology, Annex B—Relationship Between Voltage Terms And Discharge Characteristics; Annex C—Gaps and Annex D—Manufacturing.

*Primary Examiner*—Joseph Williams
*Assistant Examiner*—Hana A Sanei
(74) *Attorney, Agent, or Firm*—Robert E. Bushnell, Esq.

(57) ABSTRACT

A plasma display device enhances a shield structure for shielding electromagnetic interference (EMI) and/or noise arising in a circuit board. The plasma display device includes a plasma display panel (PDP) for displaying a predetermined image thereon. In addition, the plasma display device includes a chassis base for supporting the PDP, a circuit board installed on the chassis base, and a shield member for covering at least a portion of the circuit boards. The shield member has a conducting layer on at least one side of an insulating substrate. Using the structure described, EMI and/or noise arising from the circuit board is shielded.

19 Claims, 1 Drawing Sheet

FOREIGN PATENT DOCUMENTS

| | | |
|---|---|---|
| CN | 2485920 Y | 4/2002 |
| CN | 2569515 Y | 8/2003 |
| JP | 02-148645 | 6/1990 |
| JP | 10-163671 | 6/1998 |
| JP | 2845183 | 10/1998 |
| JP | 2917279 | 4/1999 |
| JP | 2001-043804 | 2/2001 |
| JP | 2001-325888 | 11/2001 |
| KR | 10-2003-0011647 | 2/2003 |
| KR | 10-2003-0024413 | 3/2003 |
| WO | WO03/049521 | 6/2003 |

* cited by examiner

PLASMA DISPLAY DEVICE

CLAIM OF PRIORITY

This application makes reference to, incorporates the same herein, and claims all benefits accruing under 35 U.S.C. §119 from an application entitled PLASMA DISPLAY DEVICE filed with the Korean Industrial Property Office on 26 Nov. 2003 and there duly assigned Serial No. 10-2003-0084482.

BACKGROUND OF THE INVENTION

1. Technical Field

The present invention relates to a plasma display device and, more particularly, to a plasma display device that enhances the shield structure for shielding electromagnetic interference (herein referred to as "EMI") and/or noise generated in a circuit board used therein.

2. Related Art

As is well known, a plasma display device realizes a predetermined image by employing plasma generated from gas discharge. Such a plasma display device includes a plasma display panel (PDP) for displaying a predetermined image thereon by employing plasma generated from gas discharge, a chassis base attached to the PDP to support it, and circuit boards installed on the rear surface of the chassis base to drive the PDP or the like. The PDP module as described above (or, an assembly of a PDP, a chassis base, and a circuit board) is incorporated into an outer housing to form the plasma display device.

There is a problem in that electromagnetic interference (EMI) or noise occurs or arises between or within the circuit boards while the circuit elements on the circuit boards are being electromagnetically operated in the plasma display device.

SUMMARY OF THE INVENTION

In accordance with the present invention, a plasma display device is provided in which the shield structure for shielding the EMI and/or noise of the circuit boards is enhanced.

In accordance with the another aspect of the present invention, a plasma display device of reduced weight is provided.

In accordance with another aspect of the present invention, a plasma display device having a reduced rate of occurrence of short circuits in the circuit board is provided.

In an embodiment of the present invention, the plasma display device includes a plasma display panel (PDP) for displaying images thereon, a chassis base for supporting the plasma display panel, at least one circuit board installed on the chassis base and at least one shield member covering at least a portion of the circuit board(s). The shield member includes an insulating substrate. In some embodiments, a side of the shield member is formed using an insulating substrate.

A conducting layer is formed by applying conductive paint to the insulating substrate, the insulating substrate being formed from plastic material.

The conducting layer is formed on a side of an insulating substrate remote from the circuit board. The conducting layer may be thin film applied with ELECOAT, which is a conductive material. In some embodiments, the shield member includes at least one aperture for the passage of air.

The circuit boards covered with the shield member may include an image processing board, a sustain electrode driving board, a scan electrode buffer board, a scan electrode driving board, an address buffer board, a power supply board, and a driver integrated circuit (IC), or a combination thereof.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Embodiments of the present invention will now be described in detail with reference to the accompanying drawings.

Figure 1:
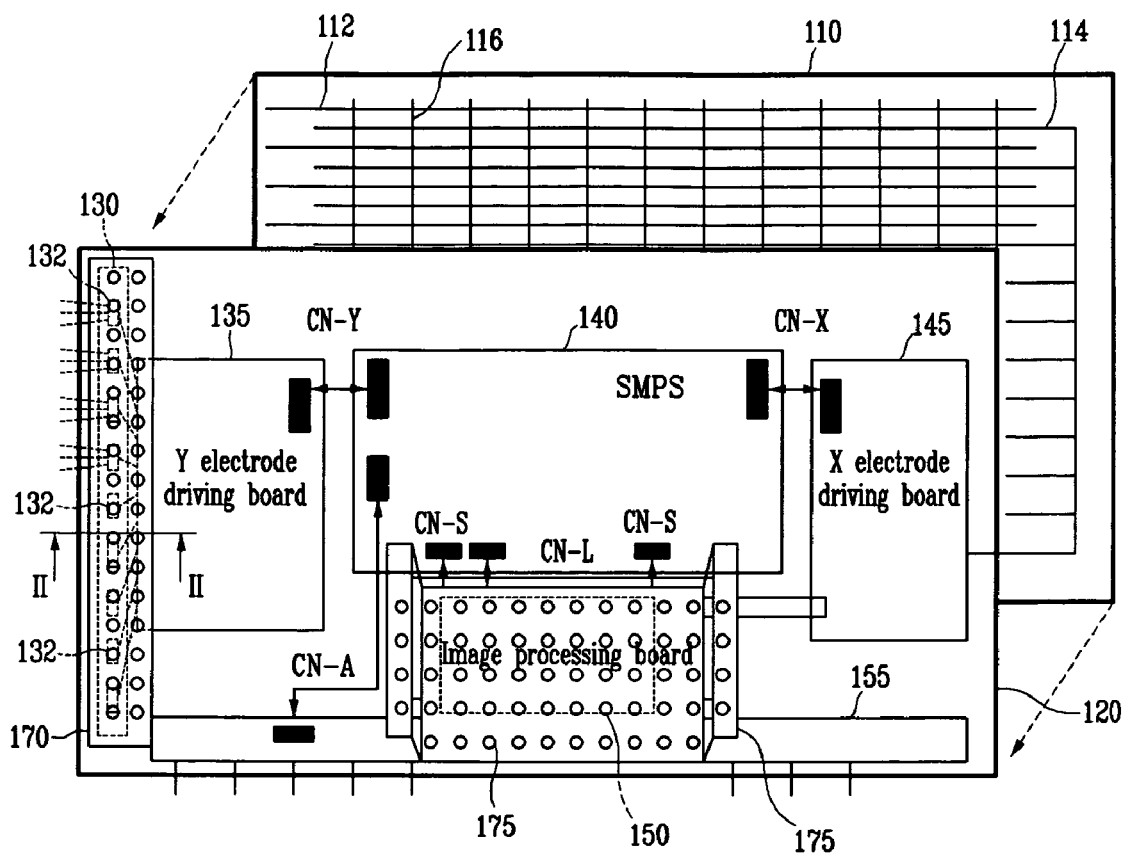
FIG. 1 schematically illustrates the structure of a plasma display device according to an embodiment of present invention.
Figure 2:
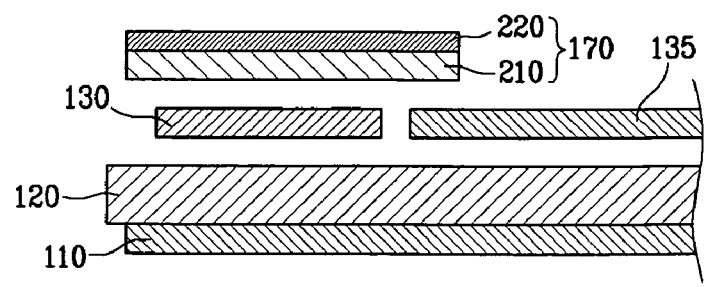
FIG. 2 is a cross-sectional view taken along line II-II of FIG. 1.

FIG. 1 schematically illustrates the structure of a plasma display device according to an exemplary embodiment of present invention, and FIG. 2 is a cross-sectional view taken along line II-II of FIG. 1.

As shown in FIG. 1, a plasma display device according to the invention includes a plasma display panel (herein referred to as PDP) 110 for displaying a predetermined image thereon, a chassis base 120 for supporting the PDP 110, at least one circuit board 130, 135, 140, 145, 150, 155 installed on the chassis base 120, and the shield members 170, 175.

In the plasma display device according to the invention, at least one of the circuit boards 130, 135, 140, 145, 150, 155 may include an X-electrode driving board 145 for driving a pair of sustain electrodes 114 (or X-electrodes) of the PDP 110, a Y-electrode driving board 135 for driving scan electrodes 112 (or Y-electrodes) of the PDP 110, a Y-electrode (or scan electrode) buffer board 130 for controlling the Y-electrode driving board 135 to drive the scan electrodes 112, an address buffer board 155 for driving address electrodes 116 of the PDP 110, an image processing board 150 for generating a signal which controls the driving of the address electrodes 116, initiating a sustain discharge between a pair of sustain electrodes 114, and transferring the signal to the circuit boards 135, 145, 155, and a power supply board 140 for supplying the circuit boards 130, 135, 140, 145, 150, 155 with power. For instance, power supply board 140 may be a switching mode power supply (herein referred to as "SMPS").

The Y-electrode driving board 135 and the X-electrode driving board 145 connect with the power supply board 140 through connecting lines CN-Y and CN-X, respectively. Each of the address buffer board 155 and the image processing board 150 electrically connects with the power supply board 140 through connecting lines CN-A, CN-S and CN-L.

In the plasma display device according to the invention, the circuit boards 130, 135, 140, 145, 150, 155 may be a printed circuit board (PCB). However, in other embodiments, circuit boards 130, 135, 140, 145, 150, 155 may be made of alternate materials, for example, of a flexible substrate such as film.

In the plasma display device according to the invention, the chassis base 120 is positioned on and fixed to a rear side of PDP 110 remote from the screen side of PDP 110. One or more of the circuit boards 130, 135, 140, 145, 150, 155 may be disposed on the rear side of the chassis base 120 remote from the PDP 110. In addition, a shield may be disposed over one or more of the circuit boards 130, 135, 140, 145, 150, 155, and may be configured to cover them.

In the above structure, the shield member is disposed entirely over one or more of the circuit boards 130, 135, 140, 145, 150, 155. In addition, shield members may be disposed partly over one or more of the circuit boards 130, 135, 140, 145, 150, 155.

Specifically, the shield members 170, 175 may be disposed over the Y-electrode buffer board 130, the Y-electrode driving board 135, the image processing board 150, and the address buffer board 155 so as to cover them.

The Y-electrode buffer board 130 is provided with at least one driver integrated circuit (IC) 132 for driving the scan electrode 112 of PDP 110. The address buffer board 155 is provided with at least one driver IC (not shown) for driving the address electrodes 116 of PDP 110. Accordingly, in some embodiments, the shield members 170, 175 may be disposed entirely over the Y-electrode buffer board 130 and the image processing board 150. In addition, shield members 170, 175 may be disposed partly over the Y-electrode driving board 135, the power supply board 140, and the address buffer board 155. A portion of the surface of the Y-electrode driving board 135 proximate the Y-electrode buffer board 130 may be covered by the shield members 170, 175. Also, the shield member 170 may cover the connection lines CN-S and CN-L of the power supply board 140 and the entire surface of the image processing board 150.

In the plasma display device, at least one of the circuit boards 130, 135, 140, 145, 150, 155 may be covered by the shield members 170, 175 as stated above. However, in some embodiments, the circuit boards 130, 135, 140, 145, 150, 155 may not be covered by a shield member, or a portion of one or more of the circuit boards 130, 135, 140, 145, 150, 155 may be covered by a shield member. Otherwise, it may be covered by the shield members 170, 175.

FIG. 2 is a cross-sectional view taken along line II-II of FIG. 1, and illustrates an embodiment of a shield member. Although the shield member 170 is illustrated in FIG. 2, the shield member 175 may have the same structure as that of shield 170 in some embodiments. Shield member 175 may be positioned to cover structures different from those covered by shield member 170.

As shown in FIG. 2, the structure of the shield member 170 may be plate-shaped. The shield member 170 may be configured to receive at least one of the circuit boards 130, 135, 140, 145, 150, 155. That is, the shield member 170 may be formed in a receptacle case with fixing members in the periphery thereof for mounting the receptacle on the chassis base 120. Also, the shield member 170 may have an insulating substrate 210 formed from a material with a low degree of conductivity, for example, plastic.

In order to enhance the efficiency in the adhesion of the shield member 170 to the chassis base 120 of PDP 110, the insulating substrate 210 may have a flexible structure, such as that of a film.

The insulating substrate 210 has a conductive layer 220 on one surface. More particularly, one dielectric surface of the insulating substrate 210 is adjacent to the rear surface of at least one of the circuit boards 130, 135, 140, 145, 150, 155. The other dielectric surface of the insulating substrate 210, which is surrounded by the conductive layer 220, is positioned opposite the outside of the plasma display device. However, the present invention is not limited to such an arrangement. Accordingly, the conductive layer 220 may be applied adjacent to at least one of the circuit boards 130, 135, 140, 145, 150, 155 only if the conductive layer 220 does not interfere with the circuit element of at least one of the circuit boards 130, 135, 140, 145, 150, 155.

In an embodiment of the plasma display, the conductive layer 220 is formed by applying a paste-like material. The paste-like material can be realized by mixing metallic filler (for instance, Ag, Ni, Cu, C and the like) with a resin and a hardener in a predetermined ratio. For example, ELECOAT, which forms metal layers on the applied surface, may be used. Therefore, the above structure prevents the circuit element(s) of circuit boards 130, 135, 140, 145, 150, 155 from receiving electromagnetic interference (EMI) or noise.

Preferably, the conductive layer 220 has a thickness of about 30 μ. Although the thickness of the conductive layer 220 is thin, it can sufficiently prevent the circuit element of any of the circuit boards 130, 135, 140, 145, 150, 155 positioned proximate the shield member from receiving electromagnetic interference (EMI) or noise. Accordingly, the conductive layer 220 may have a given thickness; more preferably, the conductive layer 220 is in the form of a film layer.

In an embodiment of the plasma display device, shield members 170, 175 may include a plurality of apertures in order that the heat generated by PDP 110 and circuit elements of circuit boards 130, 135, 140, 145, 150, 155 pass through them to the exterior. It is preferable that the plurality of apertures be formed around overheated areas.

As described above, an embodiment of the plasma display device may include a shield structure which can be formed with a material other than a metal substrate material.

The plasma display device described herein reduces the rate of occurrence of short circuits in the circuit board so that reliability of the end product is enhanced.

In addition, a thin conductive film layer formed on one surface of the shield structure effectively shields the circuit boards from EMI and/or noise while minimizing the size of PDP device.

Furthermore, apertures in the shield members allow the heat generated in the PDP to dissipate without the use of any additional means for the radiation of heat.

Although preferred embodiments of the present invention have been described in detail herein, it should be clearly understood that many variations and/or modifications of the basic inventive concept taught herein may appear to those skilled in the art and fall within the spirit and scope of the present invention, as defined in the appended claims.

What is claimed is:

1. A plasma display device, comprising:
  a plasma display panel (PDP) for displaying images thereon;
  a chassis base for supporting said plasma display panel;
  at least one circuit board installed on said chassis base;
  at least one shield member for covering at least a portion of said at least one circuit board, wherein said at least one shield member comprises an insulating substrate disposed on at least one side of said at least one shield member; and
  a conducting layer formed on a side of said insulating substrate remote from said at least one circuit board.

2. The plasma display device of claim 1, further comprising a conducting layer formed on said insulating substrate by applying conductive paint thereto.

3. The plasma display device of claim 1, wherein said insulating substrate is formed from plastic material.

4. The plasma display device of claim 1, further comprising a conducting layer, said conducting layer comprising a thin film of paste-like material obtained by mixing a metallic filler with a resin and a hardness in a predetermined ratio.

5. The plasma display device of claim 1, wherein said at least one shield member includes at least one aperture for passing air therethrough.

6. The plasma display device of claim 1, wherein said at least one circuit board comprises an image processing board.

7. The plasma display device of claim 1, wherein said at least one circuit board comprises a sustain electrode driving board.

8. The plasma display device of claim 1, wherein said at least one circuit board comprises an address buffer board.

9. The plasma display device of claim 1, wherein said at least one circuit board comprises a scan electrode driving board.

10. The plasma display device of claim 1, wherein said at least one circuit board comprises at least one driver integrated circuit (IC).

11. The plasma display device of claim 1, wherein said at least one circuit board comprises at least one of an image processing board, a sustain electrode driving board, an address buffer board, a scan electrode driving board, a power supply board, and a driver integrated circuit (IC).

12. The plasma display device of claim 1, wherein said at least one circuit board comprises one of a printed circuit board and a circuit board made of a flexible substrate.

13. The plasma display device of claim 1, wherein said chassis base is fixed to a rear side of said PDP remote from a screen side of said PDP.

14. The plasma display device of claim 13, wherein said at least one circuit board is disposed on a side of said chassis base remote from said PDP.

15. The plasma display device of claim 1, wherein said at least one shield member is plate-shaped.

16. The plasma display device of claim 1, wherein said at least one shield member is formed in a receptacle case having fixing means disposed on a periphery of said receptacle case for mounting said receptacle on said chassis base.

17. The plasma display device of claim 1, wherein said insulating substrate has a flexible structure.

18. A plasma display device, comprising:

a plasma display panel (PDP) for displaying images thereon;

a chassis base for supporting said plasma display panel;

at least one circuit board installed on said chassis base; and at least one shield member for covering at least a portion of said at least one circuit board, wherein said at least one shield member comprises an insulating substrate disposed on at least one side of said at least one shield member;

wherein said insulating substrate has a first dielectric surface adjacent to a rear surface of said at least one circuit board, and a second dielectric surface positioned opposite an exterior of said plasma display device.

19. The plasma display device of claim 1, further comprising a conductive layer formed on said insulating substrate to a thickness of about 30 μ.

* * * * *